United States Patent
Goronkin et al.

Patent Number: 5,298,441
Date of Patent: Mar. 29, 1994

[54] METHOD OF MAKING HIGH TRANSCONDUCTANCE HETEROSTRUCTURE FIELD EFFECT TRANSISTOR

[75] Inventors: Herbert Goronkin, Tempe; Jun Shen, Phoenix; Saied N. Tehrani, Scottsdale; X. Theodore Zhu, Chandler, all of Ariz.

[73] Assignee: Motorola, Inc., Schaumburg, Ill.

[21] Appl. No.: 709,741

[22] Filed: Jun. 3, 1991

[51] Int. Cl.$^5$ .................................. H01L 21/265
[52] U.S. Cl. .................................. 437/40; 437/976; 437/133; 148/DIG. 97
[58] Field of Search .................... 437/40, 976; 148/72

[56] References Cited

U.S. PATENT DOCUMENTS

| | | | |
|---|---|---|---|
| 4,568,958 | 2/1986 | Baliga | 357/16 |
| 4,695,857 | 9/1987 | Baba et al. | 257/194 |
| 4,745,447 | 5/1988 | Chen et al. | 357/16 |
| 4,829,346 | 5/1989 | Kasahara et al. | 257/190 |
| 4,885,614 | 12/1989 | Furukawa et al. | 257/190 |
| 5,048,036 | 9/1991 | Scifres et al | 357/4 |
| 5,049,951 | 9/1991 | Goronkin et al. | 3574/ |
| 5,060,030 | 10/1991 | Hoke | 357/4 |
| 5,081,511 | 1/1992 | Tehrani et al. | 357/4 |
| 5,111,255 | 5/1992 | Kiely et al. | 357/16 |

*Primary Examiner*—Olik Chaudhuri
*Assistant Examiner*—Long Pham
*Attorney, Agent, or Firm*—Robert F. Hightower; Joe E. Barbee

[57] ABSTRACT

A high transconductance HFET (21) utilizes nonalloy semiconductor materials (26) to form a strained channel layer (26) that has a deep quantum well (38). The materials utilized for layers adjacent to the channel layer (26) apply strain to the channel layer (26) and create an excess of high mobility carriers in the channel layer (26). The materials also form a deep quantum well (38) that confines the high mobility carriers to the channel (26). The high mobility carriers and the high confinement provide an HFET (21) that has high transconductance, high frequency response, and sharp pinch-off characteristics.

12 Claims, 2 Drawing Sheets

METHOD OF MAKING HIGH TRANSCONDUCTANCE HETEROSTRUCTURE FIELD EFFECT TRANSISTOR

BACKGROUND OF THE INVENTION

The present invention relates, in general, to field effect transistors, and more particularly, to a novel field effect transistor that has high transconductance.

Previously, the semiconductor industry produced P-channel field effect transistors (FETs) using both metal oxide semiconductor FET (MOSFET) technology as well as heterostructure FET (HFET) technology. For both technologies, the P-channel transistor performance was inferior to the N-channel transistor. This inferior performance appeared as a P-channel transistor that had lower transconductance, lower frequency response, and inferior pinch-off characteristics than a corresponding N-channel transistor. Precision analog and high speed digital circuits often were built using complementary structures that required both N-channel and P-channel transistors. The P-channel transistor's inferior performance limited the precision that could be obtained in complementary analog circuits. In digital circuits, the P-channel transistor resulted in high gate delays and lower operating frequencies.

Previous efforts of producing improved P-channel HFETs typically employed alloys of III-V semiconductor materials, such as indium gallium arsenide (InGaAs), as the channel material. In general, the alloy channel material was between adjacent layers of other III-V alloys such as aluminum gallium arsenide (AlGaAs). One problem of these previous HFETs was alloy scattering that occurred in the alloy channel material. As carriers traveled through the alloy, the carriers collided with the non-uniform lattice structure created by the alloy. These collisions decreased the carrier mobility and resulted in low HFET transconductance. Another disadvantage of these previous HFETs was low carrier confinement. The low mole fraction (typically less than 15 percent) concentration of small band gap material, such as indium, that could be included in these alloys was insufficient to provide a deep quantum well that confined carriers to the channel material. The primary result of the low carrier confinement was an inferior pinch-off characteristic. In addition to low confinement, the low mole fraction concentration of small band gap material also resulted in low mobility. To obtain a high mobility, the previous P-channel devices typically had to be operated at low temperatures (generally 77 degrees Kelvin or below).

Accordingly, it is desirable to have P-channel field effect transistors that have high transconductance, high mobility, high frequency response, and sharp pinch-off characteristics. It is also desirable that these P-channel HFETs have high mobility at room temperature, and that they do not suffer from alloy scattering.

SUMMARY OF THE INVENTION

Briefly stated, the present invention creates a high transconductance HFET that utilizes non-alloy semiconductor materials to form a strained channel layer that has a deep quantum well. The materials utilized for layers adjacent to the channel layer apply strain to the channel layer and provide an excess of high mobility carriers in the channel layer. The materials also form a deep quantum well that confines the high mobility carriers to the channel. The high mobility carriers and the high confinement provide an HFET that has high transconductance, high frequency response, and sharp pinch-off characteristics.

DETAILED DESCRIPTION OF THE DRAWINGS

Figure 1:
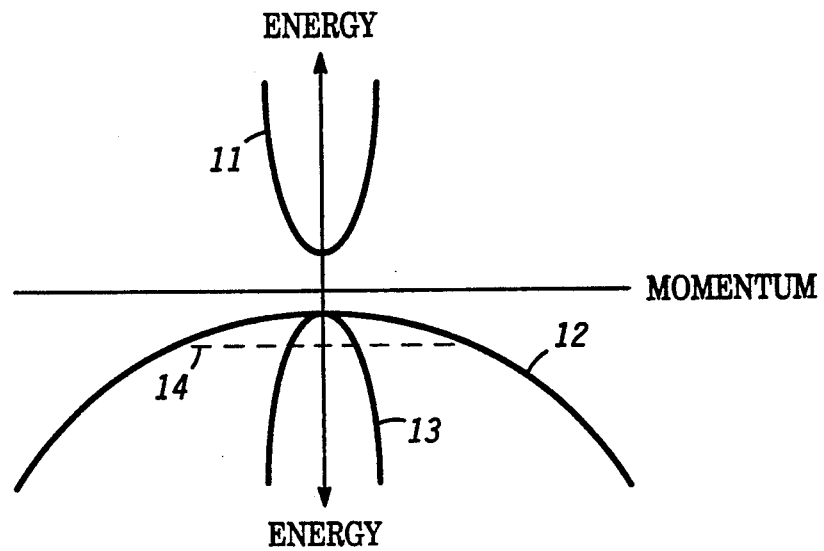
FIG. 1 is a graph illustrating carrier energy in a semiconductor material relative to carrier momentum.

The present invention achieves a high transconductance P-type field effect transistor (FET) that also has a sharp pinch-off characteristic. The high transconductance primarily results from increasing the mobility of carriers in the transistor's channel layer. The materials that are employed in the HFET apply a strain to the HFET's non-alloy channel material to increase carrier mobility.

As used herein the word(s) "strain(s)", singular or plural, means a uniaxial stress that stretches a material in its growth direction, and compresses the material in a direction that is perpendicular to the growth direction. The word(s) "alloy(s)", singular or plural, means a mixture of elements that form a material with a periodic lattice structure wherein at least one element is randomly distributed in the lattice structure. The word(s) "compound(s)", singular or plural, mean a mixture of two or more elements that form a material with a periodic lattice structure wherein all elements are arranged periodically within the periodic lattice structure. For example GaAs is a compound since gallium and arsenic are arranged periodically in a lattice structure, but InGaAs is an alloy in which indium is randomly distributed in the GaAs periodic lattice structure.

Since FETs are unipolar, the performance of P-channel FETs is predominantly determined by the characteristics of holes in the transistor's channel material. One transistor performance parameter, frequency response, is usually related to the transit time of holes across the channel, which is proportional to the mobility of the holes in the channel. Transconductance is another transistor performance parameter that is proportional to hole mobility in the channel material. Since hole mobility in silicon is about $\frac{1}{3}^{rd}$ of electron mobility in silicon, the transconductance and frequency response of P-channel silicon MOSFETs is much less than the corresponding parameters of N-channel silicon MOSFETs. For III-V compound semiconductor materials, a heterostructure FET (HFET) that has a gallium arsenide (GaAs) channel has a hole mobility that is about $1/20^{th}$ the mobility of electrons. Consequently, P-channel GaAs HFETs generally have a transconductance that is substantially less than the transconductance of similar N-channel HFETs.

Semiconductor materials used to implement these heterostructure FETs generally have two degenerate valence bands for holes, and one conduction band for electrons. One of the hole valence bands is for light holes and the other is for heavy holes. Generally, the holes that form carriers in a III-V semiconductor material are a combination of light holes and heavy holes. These light holes and heavy holes have vastly different masses with a heavy hole being over five times heavier than a light hole. Consequently, heavy holes move slower and have lower mobility than light holes. The masses of light and heavy holes for various semiconductor materials are well known in the semiconductor art.

FIG. 1 is a graph that illustrates the energy of electrons in a conduction band 11 of a semiconductor material, light holes in a valence band 13, and heavy holes in a valence band 12 of the material. The abscissa represents carrier momentum while the ordinate represents increasing energy level. Distance above the abscissa represents increasing electron energy while distance below the abscissa represents increasing hole energy. Heavy hole valence band 12 represents the energy of heavy holes as they travel in the lattice of a semiconductor material. Similarly, light hole valence band 13 represents the energy of light holes. Free holes that are able to function as carriers occupy the lowest energy states in heavy hole valence band 12 and in light hole valence band 13 as indicated by the area enclosed by a dashed line 14. Since heavy hole valence band 12 is flatter than light hole valence band 13, dashed line 14 encloses a larger number of heavy holes than light holes. This larger concentration of free heavy holes results in a material having low net hole mobility.

It has been found that the relationship between heavy hole valence band 12 and light hole valence band 13 can be altered by applying strain to the multiple valence band semiconductor material.

Figure 2:
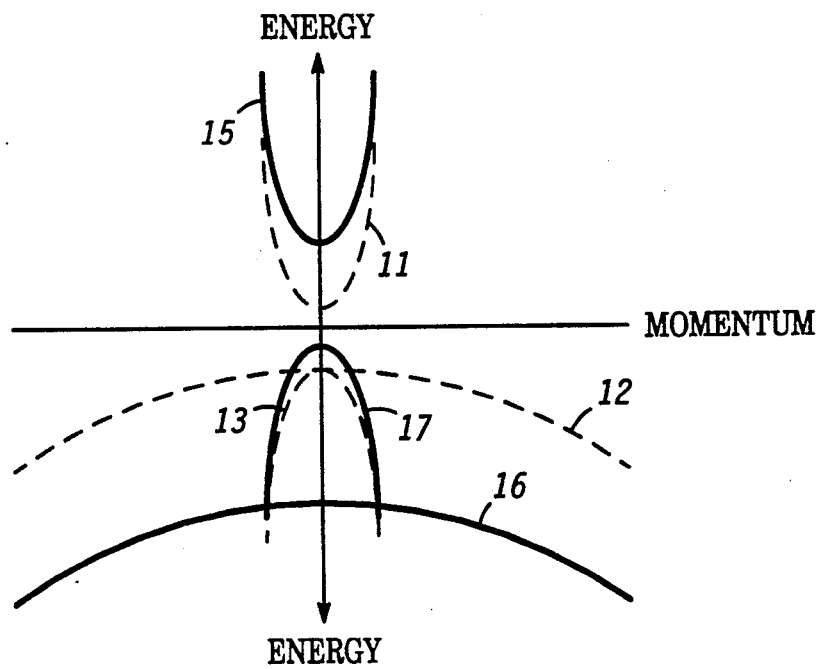
FIG. 2 is a graph illustrating carrier energy relative to carrier momentum in a strained semiconductor material in accordance with the present invention.

FIG. 2 is a graph illustrating the relationship between an electron conduction band 15, a heavy hole valence band 16, and a light hole valence band 17 that results from applying strain to a multiple valence band semiconductor material. The graph of FIG. 2 illustrates the energy of valence band 16 and 17 in a direction that is perpendicular to the growth direction of the semiconductor material. Such a view typically represents a direction that is parallel to the channel of an HFET that utilizes such a material. For reference, the position of electron conduction band 11, light hole valence band 13, and heavy hole valence band 12 from FIG. 1 is illustrated by dashed lines. Applying strain to the semiconductor material has increased conduction band energy as illustrated by conduction band 15. The strain has also increased the energy of the lowest energy state in heavy hole valence band 16 until it is greater than the energy states of light hole valence band 17. In this strained condition, the contribution of heavy holes from heavy hole valence band 16 is reduced and the predominant free holes that are available to be used as carriers are light holes from light hole valence band 17. Consequently, the strain applied to the semiconductor material has altered the relationship between available heavy holes and light holes thereby appearing to increase the available number of high mobility light holes that can be utilized as carriers. Creating such a situation in the channel layer of a P-channel HFET reduces the number of heavy holes in the HFET's channel thereby permitting high mobility light holes to become the dominant carrier and significantly increasing the HFET's mobility.

Figure 3:
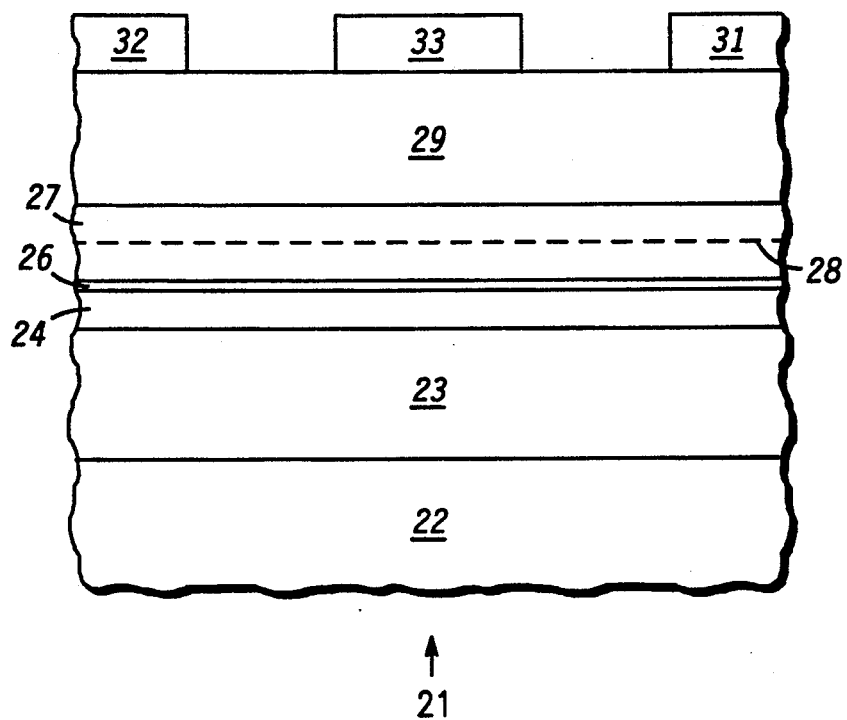
FIG. 3 is an enlarged cross section illustrating a portion of an HFET in accordance with the present invention.

Referring to FIG. 3, a high transconductance P-channel HFET 21 includes a substrate 22, a buffer layer 23, a barrier layer 24, a channel layer 26, a barrier layer 27, a transition layer 29, a source electrode 31, a drain electrode 32, and a gate electrode 33. The materials used for barrier layers 24 and 27 have a smaller lattice constant than the material used for channel layer 26. The smaller lattice constant indicates that the lattice structure of the material used for barrier layers 24 and 27 has a smaller spacing between atoms in the material's lattice structure than the material used for channel layer 26. This smaller lattice structure creates a strain on channel layer 26. The strain alters the heavy hole and light hole valence band relationship of channel layer 26 and increases the number of light holes available for use as carriers, as discussed in FIG. 2. Depending on the materials, this high concentration of light holes can provide P-channel HFET 21 a mobility that is up to six times higher than the mobility of a conventional P-channel HFET. In the preferred embodiment, channel layer 26 is an indium arsenide compound that is approximately two monolayers (approximately six angstroms) thick, barrier layer 27 is approximately one hundred fifty (150) angstroms (Å) of an aluminum arsenide compound, and barrier layer 24 is approximately two hundred Å of an aluminum arsenide compound. Also in this embodiment, buffer layer 23 and substrate 22 are a gallium arsenide compound, and transition layer 29 is approximately fifty Å of aluminum gallium arsenide with a 30% aluminum mole fraction ($Al_{0.3}Ga_{0.7}As$). The preferred embodiment's indium arsenide compound does not reduce mobility by alloy scattering of carriers that are in the channel material. Additionally, the indium arsenide is highly strained which provides a large separation between the light and heavy hole valence bands thereby greatly increasing the ratio of light holes to heavy holes. Therefore, this non-alloy channel increases carrier mobility over prior HFET's that utilized III-V alloys.

The heterostructure structure of HFET 21 is formed using conventional epitaxial techniques such as metal organic vapor phase epitaxy (MOVPE), molecular beam epitaxy (MBE), atomic layer epitaxy (ALE) or the like. Generally, buffer layer 23 is formed on substrate 22 and buffers channel layer 26 from defects and impurities in substrate 22. Barrier layer 24 is formed on buffer layer 23 and has a band gap that is larger than buffer layer 23. Next, channel layer 26 is formed on the surface of barrier layer 24 and is followed by barrier layer 27. As will be discussed hereinafter, the non-alloy material utilized for channel layer 26 has a small band gap which permits forming a deep quantum well that confines carriers to channel layer 26. Barrier layers 24 and 27 have a band gap that is larger than the band gap of channel layer 26 to facilitate forming the quantum well. During the formation of barrier layer 27 on channel layer 26, a thin doping layer 28 is created within barrier layer 27 by using a modulation doping or planar doping technique that is well known in the semiconductor art. Doping layer 28 is a material that supplies carriers to channel layer 26 and for a P-channel HFET is an acceptor material. Doping layer 28 is formed close enough to channel layer 26 so that carriers in doping layer 28 can tunnel into channel layer 26, yet is far enough away to maintain separation between carriers in channel layer 26 and donors or acceptors in supply layer 28. In the preferred embodiment, doping layer 28 is doped with beryllium at a concentration of approximately $5 \times 10^{12}$ atoms/cm$^2$, and is approximately fifty (50) angstroms from channel layer 26. After barrier layer 27 has been formed, transition layer 29 is created to facilitate forming ohmic contacts. A gate electrode 33 is formed on transition layer 29. Gate electrode 33 can be a metal that forms a Schottky barrier contact with transition layer 29, or gate 33 can be separated by a dielectric to form an insulated gate. Source electrode 31 and drain electrode 32 are formed in ohmic contact with transition layer 29.

Figure 4:
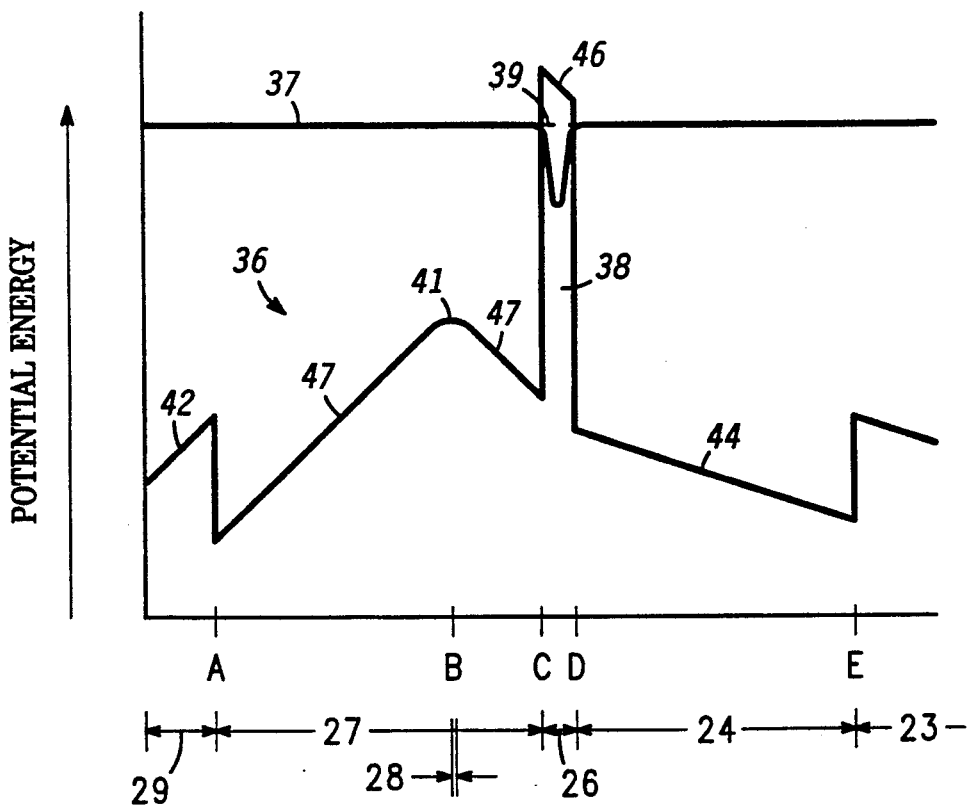
FIG. 4 is a graph illustrating hole potential energy in the valence band of an HFET in accordance with the present invention.

FIG. 4 is a graph illustrating a valence band potential energy diagram 36 of HFET 21 shown in FIG. 3. Since it is advantageous to refer to the structure that creates the valence band, this section will have references to HFET 21 of FIG. 3. The abscissa of FIG. 4 represents distance downward along a vertical line from gate 33 through the structure of HFET 21. Each point A, B, C, D, and E on the abscissa represents a heterostructure interface formed by the layers of HFET 21. These layers and interfaces are illustrated along a line parallel to the abscissa but spaced somewhat below the abscissa. This line is provided for reference and to assist in understanding energy diagram 36. Area 29 of the line represents transition layer 29, area 27 of the line represents barrier layer 27, area 28 represents doping layer 28, area 26 represents channel layer 26, area 24 represents barrier layer 24, and area 23 of the line represents buffer layer 23. The ordinate represents increasing potential energy. The large band gap of barrier layer 27 is represented by the energy level of a section 47 of energy diagram 36. A section 44 represents the energy level in barrier layer 24, and a section 46 represents the energy level in channel layer 26. Section 47 has a peak 41 that results from the carriers in doping layer 28. These carriers create an electric potential that lowers the potential energy of portions of valence band 36 thereby creating the downward slopes in valence band 36. The large band gap differential between section 46, and sections 44 and 47 creates a quantum well 38. The large band gap differential ensures that quantum well 38 is deep in order to provide high carrier confinement in channel layer 26.

A hole wave function 37 illustrates this high carrier confinement. Hole wave function 37 is a graph illustrating the probability that an energy state in valence band 36 is occupied by a hole. Downward excursions of hole wave function 37 represent increased probability. Hole wave function 37 is superimposed on the ground state or lowest quantized state in quantum well 38 as represented by a dashed line 39. Hole wave function 37 shows that the probability of a hole occupying a state in the valence band is practically zero in areas outside quantum well 38 and extremely high inside quantum well 38. Therefore carriers are well confined within channel 26 and not spread throughout barrier layers 24 and 27, thereby permitting gate 33 of HFET 21 to accurately control carrier concentration. Consequently, utilizing a very small band gap material for channel layer 26 increases carrier confinement in HFET 21, thereby providing a sharp pinch-off characteristic, and also increasing transconductance.

Therefore, HFET 21 utilizes lattice structure differences to create high mobility carriers in channel layer 26. There is a large difference between the lattice constant of channel layer 26 and barrier layers 24 and 27. This large lattice constant difference places a large strain on channel layer 26 and results in a large separation between the heavy and light hole valence bands. Consequently, the free hole population in the channel is dominated by light holes thereby providing high hole mobility. The material utilized for channel layer 26 is a non-alloy material which eliminates alloy scattering of carriers in the channel thereby improving carrier mobility. Additionally, HFET 21 utilizes the band gap differential between channel layer 26 and barrier layers 24 and 27 to form a deep quantum well that confines the high mobility carriers to channel layer 26 thereby improving the transconductance, pinch-off characteristics, and frequency response of HFET 21.

Referring back to FIG. 3, the preferred embodiment of HFET 21 utilizes an aluminum arsenide compound for barrier layers 24 and 27, and an indium arsenide compound for channel layer 26. The resulting quantum well is approximately 0.85 ev. deep and provides high carrier confinement. Indium arsenide and aluminum arsenide were chosen not only for the large band gap differential, but also because aluminum arsenide's lattice constant is approximately 6.6% smaller than indium arsenide's lattice constant.

Prior P-channel HFETs typically had a small lattice constant differential that provided a small separation in the heavy and light hole valence bands. As a result, carriers could easily transit between the HFET's heavy and light hole valence bands with the majority of holes residing in the heavy hole valence band. To improve mobility, the previous P-channel HFETs typically had to be operated at low temperatures.

The preferred embodiment of the present invention employs an aluminum arsenide lattice structure that highly strains the indium arsenide lattice structure and results in a predominance of light holes as carriers. The high strain and large band gap differential increases mobility and confinement. Consequently, it is not necessary to cool HFET 21 to low temperatures in order to attain high mobility, and high transconductance.

Other compounds can also create an abundance of light holes and form a deep quantum well. One such combination is an indium antimonide channel layer with adjacent aluminum antimonide barrier layers.

In an alternate embodiment, a high mobility HFET is formed from silicon and germanium. In this embodiment, the HFET is an insulated gate transistor that has a silicon substrate. The channel layer is approximately six monolayers of germanium while the adjacent barrier layers are silicon. There is an approximately 4.1% lattice mismatch between silicon and germanium which compresses the germanium channel layer and creates light holes which become the dominant carriers. Additionally, the difference between the valence band edge of silicon and the valence band edge of germanium is approximately 0.74 ev. This differential forms a deep quantum well that confines carriers to the channel layer. Since silicon and germanium are elements, there is no alloy scattering in the channel thereby further increasing carrier mobility. The resulting HFET has high mobility, high frequency response, sharp pinch-off characteristics, and high transconductance.

By now it should be appreciated that there has been provided a novel way to provide a P-channel HFET with high transconductance. Using compounds instead of alloys eliminates alloy scattering and increases carrier mobility. By using channel layer and barrier layer materials that produce a large strain on the channel layer, the mobility of carriers in the channel is further increased thereby increasing the HFET's transconductance and frequency response. Utilizing a channel layer material that has a much smaller band gap than the adjacent material, creates a deep quantum well that increases carrier confinement throughout the channel. The high confinement provides sharp pinch-off characteristics and high transconductance, while the high mobility provides high transconductance, and high frequency response. The resulting HFET can be utilized as the P-channel transistor in complementary FET circuits to provide high speed digital and high precision analog circuits.

While the invention is described with specific preferred embodiments, it is evident that many alternatives and variations will be apparent to those skilled in the semiconductor arts. More specifically the invention has been described for a particular digital HFET transistor structure, although the method is directly applicable to HFETs with other structures, as well as to other materials.

We claim:

1. A method of forming a high transconductance field effect transistor comprising:
    providing a substrate;
    forming a first barrier layer on the substrate wherein the first barrier layer is a non-alloy material having a first lattice structure and a first band gap;
    forming a thin channel layer on the first barrier layer wherein the channel layer has a second lattice structure and a second band gap that forms a quantum well, and wherein the thin channel layer is a non-alloy material for reducing alloy scattering in the channel layer; and
    forming a second barrier layer on the channel layer wherein the second barrier layer is a non-alloy material having a third lattice structure and a third band gap wherein the first lattice structure and the third lattice structure are smaller than the second lattice structure for the purpose of applying strain to the second lattice structure and increasing light hole concentrations in the thin channel layer thereby increasing carrier mobility in the thin channel layer.

2. The method of claim 1 wherein forming the first barrier layer includes forming an aluminum antimonide barrier layer.

3. The method of claim 1 wherein the forming the second barrier layer step includes forming the second barrier layer having the third band gap wherein the second band gap is smaller than the first band gap and smaller than the third band gap.

4. The method of claim 1 wherein forming the thin channel layer includes forming an indium antimonide channel layer.

5. The method of claim 1 wherein forming the second barrier layer includes forming an aluminum antimonide barrier layer.

6. The method of claim 1 further including doping a thin portion of the second barrier layer for supplying carriers to the thin channel layer.

7. The method of claim 6 wherein doping the thin portion of the second barrier layer includes doping the thin portion of the second barrier layer with beryllium by using a planar doping technique.

8. A method of forming a high transconductance field effect transistor comprising:
    increasing mobility of the transistor by increasing availability of high mobility carriers in a channel layer of the transistor by applying strain to the lattice structure of the channel layer using a lattice structure mismatch between the channel layer and adjacent barrier layers;
    increasing confinement of the high mobility carriers to the channel layer by using a channel layer material having a small band gap and adjacent barrier layer materials that have a large band gap thereby forming a deep narrow quantum well and lowering the ground state in the quantum well; and
    avoiding alloy scattering in the channel layer by using non-alloy materials for the channel layer and the adjacent barrier layer.

9. The method of claim 8 wherein using the lattice structure mismatch between the channel layer and the adjacent barrier layers includes using adjacent silicon barrier layers.

10. The method of claim 8 wherein increasing availability of high mobility carriers in the channel layer includes using a germanium channel layer.

11. The method of claim 10 wherein using the germanium channel layer includes using approximately six monolayers of germanium.

12. The method of claim 8 wherein using the lattice structure mismatch between the channel layer and adjacent barrier layers includes using a lattice structure mismatch of at least 4.1 percent.

* * * * *